(12) United States Patent
Watanabe

(10) Patent No.: US 10,693,488 B2
(45) Date of Patent: Jun. 23, 2020

(54) DIGITALIZATION DEVICE

(71) Applicant: DENSO CORPORATION, Kariya, Aichi-pref. (JP)

(72) Inventor: Takamoto Watanabe, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 16/506,191

(22) Filed: Jul. 9, 2019

(65) Prior Publication Data
US 2019/0334542 A1    Oct. 31, 2019

Related U.S. Application Data

(63) Continuation of application No. PCT/JP2018/015390, filed on Apr. 12, 2018.

(30) Foreign Application Priority Data

Apr. 14, 2017   (JP) .................................. 2017-080543

(51) Int. Cl.
| | |
|---|---|
| H03M 1/60 | (2006.01) |
| H03M 1/50 | (2006.01) |
| G04F 10/00 | (2006.01) |
| H03K 5/131 | (2014.01) |
| H03M 1/20 | (2006.01) |
| H03M 1/10 | (2006.01) |
| H03M 1/00 | (2006.01) |
| H03M 1/12 | (2006.01) |
| H03B 19/00 | (2006.01) |

(52) U.S. Cl.
CPC .......... *H03M 1/502* (2013.01); *G04F 10/005* (2013.01); *H03K 5/131* (2013.01); *H03M 1/20* (2013.01); *H03M 1/60* (2013.01); *H03B 19/00* (2013.01); *H03M 1/00* (2013.01); *H03M 1/10* (2013.01); *H03M 1/12* (2013.01)

(58) Field of Classification Search
CPC . H03M 1/00; H03M 1/12; H03M 1/10; H03B 19/00
USPC .................. 341/157, 155, 166, 120; 327/105
See application file for complete search history.

(56) References Cited

U.S. PATENT DOCUMENTS

| | | |
|---|---|---|
| 5,416,444 A | 5/1995 | Yamauchi et al. |
| 5,528,200 A | 6/1996 | Yamauchi et al. |
| 7,888,973 B1 * | 2/2011 | Rezzi ...................... H03L 7/085 327/105 |
| 2003/0201927 A1 | 10/2003 | Watanabe et al. |

* cited by examiner

*Primary Examiner* — Joseph J Lauture
(74) *Attorney, Agent, or Firm* — Posz Law Group, PLC

(57) ABSTRACT

A digitalization device includes a first pulse delay unit, a second pulse delay unit, and an addition output unit. The first pulse delay unit includes ($2^n-(2m-1)$) first delay units connected in series, and outputs a first signal according to the number of first delay units through which a first pulse signal passes. The second pulse delay unit includes ($2^n+(2m-1)$) second delay units connected in series, and outputs a second signal according to the number of the second delay units through which a second pulse signal passes. Here, n and m are natural numbers, and n≥m. The addition output unit outputs, as a digital value, an addition value obtained by adding a numerical value based on the output of the first pulse delay unit and a numerical value based on the output of the second pulse delay unit.

4 Claims, 4 Drawing Sheets

DIGITALIZATION DEVICE

CROSS REFERENCE TO RELATED APPLICATION

The present application is a continuation application of International Patent Application No. PCT/JP2018/015390 filed on Apr. 12, 2018, which designated the U.S. and claims the benefit of priority from Japanese Patent Application No. 2017-080543 filed on Apr. 14, 2017. The entire disclosures of all of the above applications are incorporated herein by reference.

TECHNICAL FIELD

The present disclosure relates to a technique for outputting analog information as a digital value.

BACKGROUND

An A/D converter as a digitalization device outputs analog information as a digital value by circulating a pulse signal at a speed corresponding to the delay time of each delay unit in a pulse delay circuit formed by connecting a plurality of delay units formed of various gate circuits in a ring shape, and by counting the number of delay units through which the pulse signal has passed.

SUMMARY

According to an example embodiment, a digitalization device includes a first pulse delay unit, a second pulse delay unit, and an addition output unit. The first pulse delay unit includes ($2^n-(2m-1)$) first delay units connected in series, and outputs a first signal according to the number of first delay units through which a first pulse signal passes. The second pulse delay unit includes ($2^n-(2m+1)$) second delay units connected in series, and outputs a second signal according to the number of the second delay units through which a second pulse signal passes. Here, n and m are natural numbers, and n≥m. The addition output unit outputs, as a digital value, an addition value obtained by adding a numerical value based on the output of the first pulse delay unit and a numerical value based on the output of the second pulse delay unit.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

In a conceivable A/D converter, by arranging the pulse delay circuits with the number of the N-th power of two, it suppresses so-called code omission that occurs in the process of encoding the phase difference of pulse signals into a binary digital signal when the number of pulse delay circuits is an odd number.

According to a conceivable technique, although the code omission can be suppressed, additional NAND circuits and bypass lines are required in order to invert pulses in delay units with an even number. As a result of detailed investigations by the inventor, in the conceivable technique, a difficulty is found out such that the accuracy in outputting analog information as digital values is decreased by generation of a difference in delay time in each delay unit or a generation of a parasitic capacitance.

A technique is provided for improving the accuracy in outputting analog information as digital values while suppressing code omission when outputting analog information as digital values.

A digitalization device according to an example embodiment includes a first pulse delay unit, a second pulse delay unit, and an addition output unit.

The first pulse delay unit includes a plurality of delay units connected in series by (the n-th power of 2 minus (2m−1)), and outputs a signal according to the number of pulse signals passing through the plurality of delay units. The second pulse delay unit includes a plurality of delay units connected in series by (the n-th power of 2 plus (2m−1)), and outputs a signal according to the number of pulse signals passing through the plurality of delay units. Here, n and m are natural numbers, and n≥m.

The addition output unit is configured to output, as a digital value, an addition value obtained by adding a numerical value based on the output of the first pulse delay unit and a numerical value based on the output of the second pulse delay unit.

According to such a digitalization device, using a pulse delay unit in which the number of delay units is set to (the n-th power of 2 plus/minus (2m−1)), these outputs are added so that a digital value is generated. Therefore, even if code omission or code increase occurs in each delay unit, the code omission and the code increase can be cancelled by the addition of them. Therefore, in the technique of outputting analog information as digital values, it is possible to improve the accuracy in outputting analog information as digital values while suppressing code omission.

Hereinafter, embodiments of the present disclosure will be described with reference to the drawings.

1. Embodiment

[1-1. Configuration]

Figure 1:
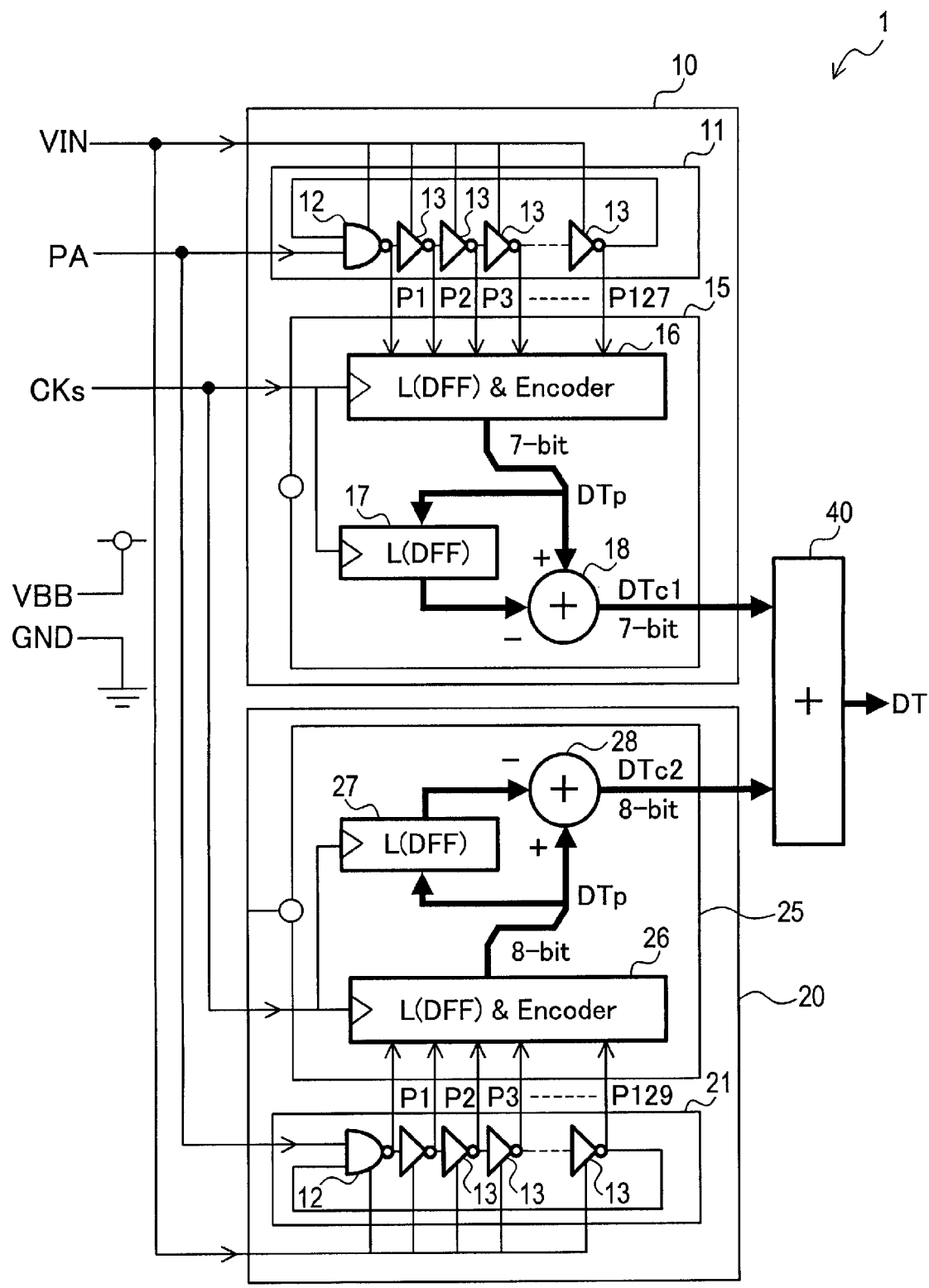
FIG. 1 is a block diagram showing the configuration of an A/D converter.

The A/D converter 1 shown in FIG. 1 is a device configured to output predetermined analog information as digital values. In particular, the A/D converter 1 of the present embodiment functions as an A/D converter, i.e., an analog-digital converter that outputs a digital value corresponding to the potential of the analog input signal.

The A/D converter 1 shown in FIG. 1 includes a first TAD 10, a second TAD 20, and an addition output unit 40.

The first TAD 10 and the second TAD 20 receive a power supply voltage VBB, a ground voltage GND, a pulse signal PA, a clock CKs, and an analog signal VIN. The first TAD 10 and the second TAD 20 have a function as a conventional A/D converter that outputs an A/D conversion value.

Here, the A/D conversion value represents a digital value corresponding to the voltage of the input analog signal, and in the present embodiment, indicates numerical data DTc1 and DTc2. The numerical data DTc1 and DTc2 are input to the addition output unit 40.

The addition output unit 40 calculates the sum of the numerical data DTc1 and the numerical data DTc2, that is, (DTc1+DTc2), and outputs the sum as A/D conversion data DT of the analog input signal Vin. Here, the first TAD 10 and the second TAD 20 include ring-shaped pulse delay circuits 11 and 21 and encoding circuits 15 and 25.

Figure 2:
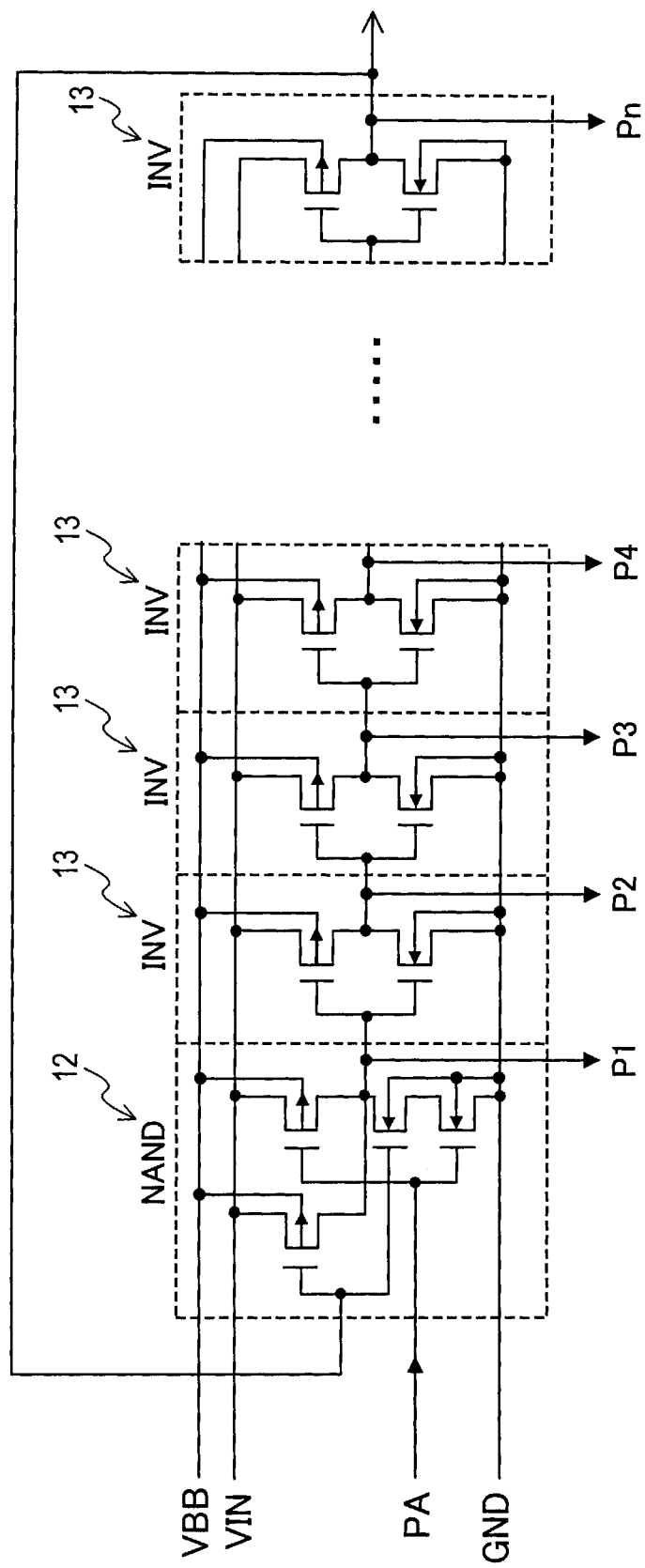
FIG. 2 is a circuit diagram showing an example of a ring oscillator.

As shown in FIGS. 1 and 2, the ring-shaped pulse delay circuits 11 and 21 include a plurality of delay units, and the plurality of delay units constitute a pulse delay circuit and function as a time A/D conversion circuit. The ring-shaped pulse delay circuits 11 and 21 include, as a plurality of delay units, one negative conjunction circuit NAND12 that operates by receiving the pulse signal PA at one input end, and a plurality of inverters INV13 as an inversion circuit with the even number of inverters. These delay units are connected in a ring shape to form a ring delay line.

In particular, in the present embodiment, the first TAD 10 includes a plurality of delay units connected in series by 127 delay units, i.e., (the 7th power of two minus one). That is, one negative conjunction circuit NAND12 and 126 inverters INV13 are provided.

The second TAD 20 includes a plurality of delay units connected in series by 129 delay units, that is, (the 7th power of two plus one). That is, one negative conjunction circuit NAND12 and 128 inverters INV13 are provided.

Here, each TAD 10, 20 is configured to operate by receiving a pulse signal PA from the external element. The delay unit constituting the ring-shaped pulse delay circuits 11 and 21 includes a CMOS inverter (i.e., the INV13) and a CMOS NAND gate (i.e., the NAND12), each of which comprises a P-channel transistor and an n-channel transistor, as illustrated in FIG. 2.

A positive power supply line and a negative power supply line are connected to each of the delay units, and each delay unit applies a positive power supply voltage to the power supply terminal VIN, and the ground terminal GND has an electric potential lower than the power supply terminal VIN. Thus, the pulse signal PA is transmitted while being delayed for a delay time corresponding to the voltage between the terminals. That is, the first TAD 10 and the second TAD 20 are configured such that the analog signal is input to the pulse delay circuit as VIN, and the speed at which the pulse signal PA circulates while passing through the delay unit is changed according to the potential of VIN.

Further, as shown in FIG. 2, VBB, which is a power supply, is applied to the back gate bias of the P channel transistor constituting the NAND 12 and the INV 13 included in the delay unit. The speed at which the pulse signal PA passes through the delay unit can also be changed by the potential of the VBB.

Here, "speed" indicates the number of delay units through which the pulse signal can pass per unit time. As the speed increases, the number of delay units through which the pulse signal can pass increases.

The encoding circuits 15 and 25 include latches & encoders 16 and 26, latches 17 and 27, and adders 18 and 28, respectively.

The latches & encoders 16 and 26 import the outputs P1 to P127 or P1 to P129 of the delay units constituting the ring-shaped pulse delay circuits 11 and 21 at a predetermined timing according to the clock CKs, and generate an output data, i.e., the numerical data corresponding to the position of the pulse signal passing through the delay unit. The output DTp from the latch & encoder 16 in the first TAD 10 is output in 7 bits, and the output DTp from the latch & encoder 26 in the second TAD 20 is output in 8 bits.

These outputs DTp are input to latches 17 and 27 and adder 18, respectively. The latches 17 and 27 hold the latest output DTp received from the latch & encoder 26, and send the output DTp held immediately before the latest output DTp as a comparison value to the adders 18 and 28.

The adders 18 and 28 subtract the comparison value from the latest output DTp. Thus, the difference in the position of the pulse signal before and after the lapse of the time corresponding to the number of clocks CKs set in advance is calculated. Here, the subtraction using a complement number in binary numbers is performed so that the subtraction can be performed in the adder 28. The adders 18 and 28 output the calculation results as DTc1 and DTc2 to the addition output unit 40.

Figure 3:
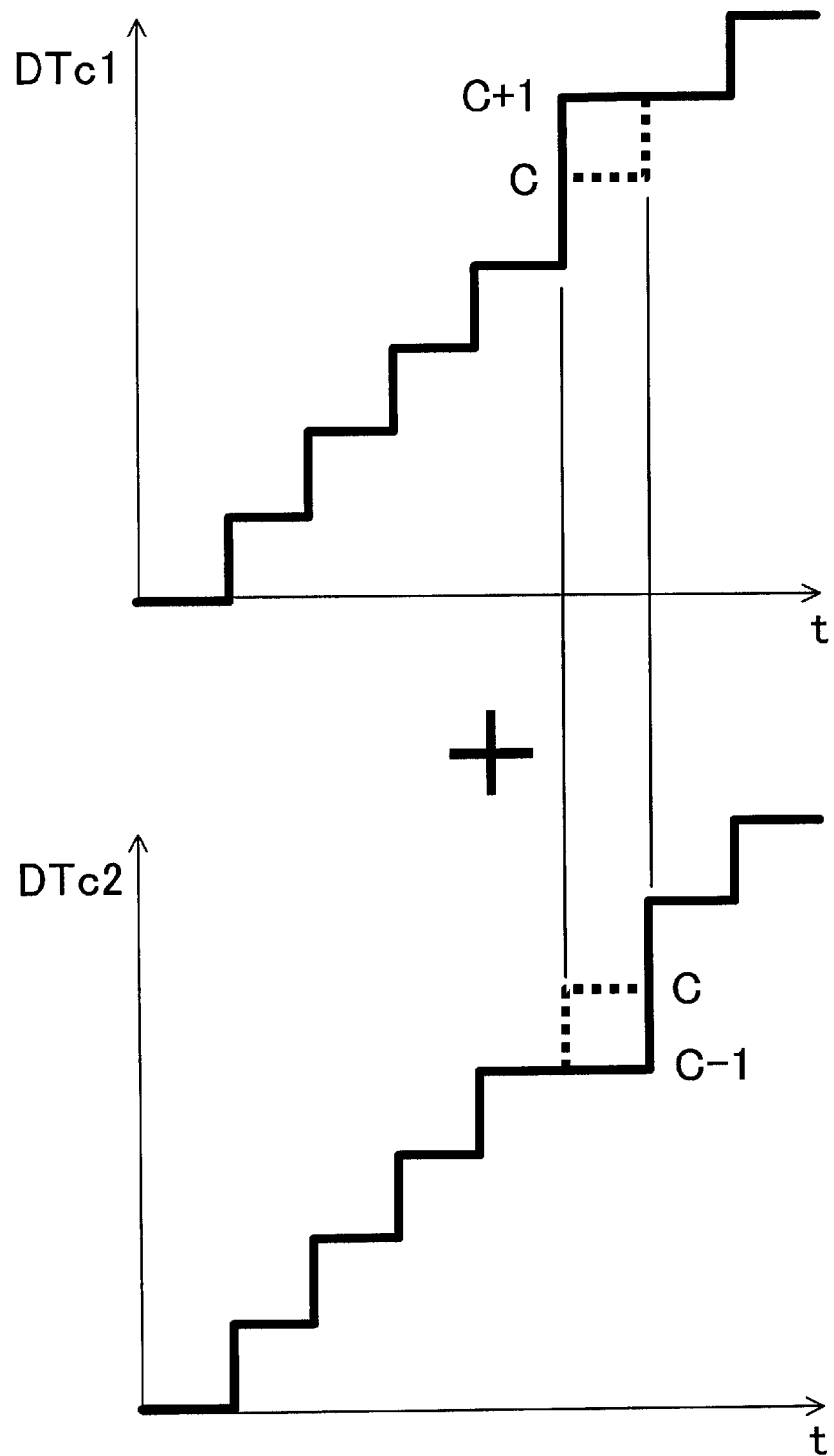
FIG. 3 is an explanatory diagram showing code omission and code increase.

When the subtraction using the complement number is performed in the adders 18 and 28, the code increase may occur that represents phenomenon that the output DTc1 from the first TAD 10 is greater by one than the correct value C since the number of delay units is smaller by 1 than the n-th power of 2, as shown in the upper diagram of FIG. 3. On the other hand, the code decrease may occur that represents phenomenon that the output DTc2 from the second TAD 20 is smaller by one than the correct value C since the number of delay units is greater by 1 than the n-th power of 2, as shown in the lower diagram of FIG. 3.

Figure 4:
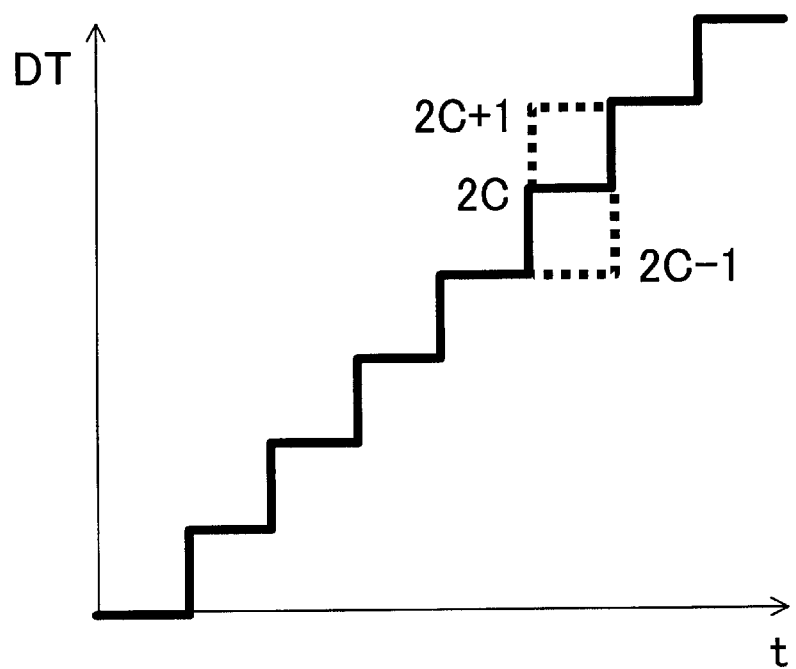
FIG. 4 is an explanatory diagram showing how a missing code and a code increase are cancelled.

However, the addition output unit 40 adds and outputs the outputs DTc1 and DTc2 from the TADs 10 and 20. Therefore, as shown in FIG. 4, the correct value 2C is output by compensating these phenomena even if the code increase and the code decrease are generated at the same time.

[1-2. Effect]

According to the first embodiment detailed above, the following effects may be obtained.

(1a) The A/D converter 1 of the above embodiment includes the first TAD 10, the second TAD 20, and the addition output unit 40.

In the A/D converter 1 described above, the first TAD 10 includes a plurality of delay units connected in series by the number of the n-th power of 2 minus one, and the second TAD 20 includes a plurality of delay units connected in series by the number of the n-th power of 2 plus one. Further, in the first TAD 10 and the second TAD 20, the plurality of delay units are connected in series in a ring shape.

The addition output unit 40 is configured to output, as a digital value, an added value obtained by adding the numerical value based on the output by the first TAD 10 and the numerical value based on the output by the second TAD 20. Here, n is a natural number.

According to such an A/D converter 1, since the pulse delay unit is used such that the number of delay units is set to be (the n-th power of two plus/minus one) and these outputs are added to generate a digital value, even if the code omission and the code increase occur in each delay unit, they can be compensated by adding these values. Therefore, in the technique of outputting analog information as digital values, it is possible to improve the accuracy in outputting analog information as digital values while suppressing code omission.

(1b) Also, according to such an A/D converter 1, the output difference from the first TAD 10 and the second TAD 20 can be reduced, so the accuracy in outputting analog information as digital values is further improved.

(1c) Further, according to such an A/D converter 1, since the number of the negative conjunction circuits NAND13 can be reduced, the difference in delay time in the delay unit derived from the difference in the type of delay unit can be made smaller.

(1d) In the A/D converter 1 of the above embodiment, the first TAD 10 and the second TAD 20 input analog signals to the pulse delay circuit, and the speed at which the pulse signal passes the delay unit changes according to the potential of the analog signal.

According to such an A/D converter 1, since it is possible to output a digital value corresponding to the potential of an analog signal, it can function as an A/D converter.

[2. Other Embodiments]

While one embodiment of the present disclosure has been described above, the present disclosure is not limited to the embodiment described above and can be carried out with various modifications.

(2a) In the above embodiment, the number of delay units in each of the TADs 10 and 20 is set to be ($2^n\pm1$). Alternatively, the number may not be limited to this value. For example, the number of delay units in each of the TADs 10 and 20 may be configured to be ($2^n\pm(2m-1)$).

Thus, the first TAD 10 may include a plurality ($2^n-(2m-1)$) of delay units connected in series, and output a signal according to the number of the delay units through which the pulse signal passes. On the other hand, the second TAD 20 may include a plurality ($2^n+(2m-1)$) of delay units connected in series, and output a signal according to the number of the delay units through which the pulse signal passes. Here, n and m are natural numbers, and n≥m.

(2b) In the above embodiment, a plurality of delay units are connected in series in a ring shape. Alternatively, the shape may not be limited to this feature. For example, a plurality of delay units may be arranged linearly, and when a pulse passes through the last delay unit, another pulse may be input to the first delay unit.

Even in this case, substantially the same effect as the above (1a) can be obtained.

(2c) In the above embodiment, although an example in which the digitalization device of the present disclosure functions as an A/D converter has been described, the present disclosure may not be limited to this feature. For example, it may be configured as a digitalization device that outputs preset analog information such as time, temperature, stress, etc. as digital values.

Regarding time, when VIN, VBB and GND are constant, and CKs is input at the measurement start time and measurement end time, a value representing the difference between these times is obtained as a digital value.

With regard to temperature and stress, the digital values, obtained when VIN, VBB and GND are constant, and the interval at which CKs is input is constant, are preliminarily recorded at each temperature and stress. When the temperature and stress are actually measured, it may be determined to which temperature or stress the obtained digital value corresponds.

Also in this case, substantially the same effect as the above (1a) can be obtained.

(2d) A plurality of functions of one element in the above embodiment may be implemented by a plurality of elements, or one function of one element may be implemented by a plurality of elements. Further, a plurality of functions of a plurality of elements may be implemented by one element, or one function implemented by a plurality of elements may be implemented by one element. A part of the configuration of the above embodiment may be omitted. At least a part of the configuration of the above embodiment may be added to or replaced with another configuration of the above embodiment.

(2e) The present disclosure can be realized in various forms, such as a system digitalization method using the digitalization device as a component, in addition to the digitalization device including the A/D converter described above.

[3. Correspondence Relation Between the Configuration of the Present Embodiments and the Configuration of the Present Disclosure]

The A/D converter 1 in the above embodiment corresponds to the digitalization device in the present disclosure, and the first TAD 10 in the above embodiment corresponds to the first pulse delay unit in the present disclosure. The second TAD 20 in the above embodiment corresponds to a second pulse delay unit in the present disclosure, and the addition output unit 40 in the above embodiment corresponds to an addition output unit in the present disclosure.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A digitalization device configured to output predetermined analog information as a digital value, the digitalization device comprising:

a first pulse delay unit that includes a plurality ($2^n-(2m-1)$) of first delay units connected in series, and outputs a first signal corresponding to a numerical number of the first delay units through which a first pulse signal passes;

a second pulse delay unit that includes a plurality ($2^n+(2m-1)$) of second delay units connected in series, and outputs a second signal corresponding to a numerical number of the second delay units through which a second pulse signal passes; and an addition output unit that outputs, as the digital value, an addition value obtained by adding a first numerical value based on a first output from the first pulse delay unit and a second numerical value based on a second output from the second pulse delay unit, wherein:

n and m are natural numbers; and n≥m.

2. The digitalization device according to claim 1, wherein:

the plurality of first delay units are connected in series in a ring shape; and the plurality of second delay units are connected in series in a ring shape.

3. The digitalization device according to claim 1, wherein:

the first pulse delay unit input an analog signal to one of the plurality of first delay units to change a speed, at which the first pulse signal passes through the one of the plurality of first delay units, according to an electric potential of the analog signal; and the second pulse delay unit input another analog signal to one of the plurality of second delay units to change a speed, at which the second pulse signal passes through the one of the plurality of second delay units, according to an electric potential of the another analog signal.

4. The digitalization device according to claim 1, wherein:

the first pulse delay unit includes the plurality ($2^n-1$) of first delay units connected in series; and the second pulse delay unit includes the plurality ($2^n+1$) of second delay units connected in series.

* * * * *